United States Patent
Rajavel et al.

[11] Patent Number: 5,742,089
[45] Date of Patent: Apr. 21, 1998

[54] GROWTH OF LOW DISLOCATION DENSITY HGCDTE DETECTOR STRUCTURES

[75] Inventors: Damodaran Rajavel, Aaoura; Terence J. de Lyon, Newbury Park, both of Calif.

[73] Assignee: Hughes Electronics, Los Angeles, Calif.

[21] Appl. No.: 484,802

[22] Filed: Jun. 7, 1995

[51] Int. Cl.$^6$ .............................. H01L 21/00; H01L 31/00
[52] U.S. Cl. .............................. 257/442; 438/95
[58] Field of Search ............... 437/3, 2; 148/33.5, 148/33.1, DIG. 63, DIG. 64; 257/442; 250/332, 338.4, 370.13; 438/95

[56] References Cited

U.S. PATENT DOCUMENTS

| | | | |
|---|---|---|---|
| 4,639,756 | 1/1987 | Rosebeck et al. | 257/442 |
| 4,689,650 | 8/1987 | Dinan | 257/442 |
| 4,910,154 | 3/1990 | Zanio et al. | 437/5 |
| 4,935,385 | 6/1990 | Biegelsen | 437/111 |
| 4,994,867 | 2/1991 | Biegelsen | 357/16 |
| 5,264,699 | 11/1993 | Barton et al. | 250/370.13 |
| 5,306,386 | 4/1994 | De Lyon | 437/105 |
| 5,380,669 | 1/1995 | Norton | 437/10 |
| 5,382,542 | 1/1995 | Zinck et al. | 437/126 |
| 5,581,117 | 12/1996 | Kawano | 257/442 |

OTHER PUBLICATIONS

H. Zogg, A.N. Tiwari, S. Blunier, C. Maissen, J. Masek *Heteroepitaxy of II–VI semiconductors on Si substrates.*

T.J. de Lyon, J.A. Roth, O.K. Wu *Direct molecular–beam epitaxial growth of ZnTe (100) and CdZnTe(100)/ZnTe(100) on Si (100) substrates*.

Y.P. Chen, S. Sivananthan and J.P. Faurie *Structure of CdTe(111) B Grown by MBE on Misoriented Si (100).*

*Primary Examiner*—Brian Dutton
*Attorney, Agent, or Firm*—V. D. Duraiswamy; W. K. Denson-Low

[57] ABSTRACT

An epitaxial structure and method of manufacture for a infrared detector device with low dislocation density, especially for high performance large area focal plane arrays. Preferably, the epitaxial structure includes a buffer layer comprising a Hg-based II–VI material and an overlayer comprising a detector comprising a Hg-based II–VI material. The buffer layer is transparent at the operating frequencies of the detector.

7 Claims, 2 Drawing Sheets

GROWTH OF LOW DISLOCATION DENSITY HGCDTE DETECTOR STRUCTURES

BACKGROUND OF THE INVENTION

1. Field of the Invention

The present invention relates to semiconductor detector structures and more specifically, to the vapor phase growth of infrared detector structures on Si- or Ge-based substrates. Of particular interest are the growth of high performance large area focal plane arrays (FPAs) of Hg-based II–VI semiconductors such as HgCdTe on Si- or Ge-based substrates.

2. Description of Related Art

Commercial hybrid long-range wavelength infrared (LWIR) and mid-range wavelength infrared (MWIR) detector arrays are fabricated by depositing HgCdTe detector structures on bulk CdZnTe substrates, and the individual pixels are indium bump-bonded to an Si readout chip. However, because the coefficients of thermal expansion of the Si readout chip and the HgCdTe/CdZnTe structure are different, repeated cycling between room temperature and the operating temperature (about 77K) results in the delamination of the indium bump-bonds, leading to detector pixel failure. This problem is particularly severe in large area FPAs, having a dimension equal to or greater than 100×100 elements.

This hybridization reliability problem can be overcome if the HgCdTe detector structure is deposited on a silicon substrate. In this case, the HgCdTe layer contracts and expands in compliance with the silicon substrate during thermal cycling. Thus, for example, large area FPAs with superior detector specifications can be realized by growing a HgCdTe detector structure on a silicon substrate to match the expansion coefficient of the silicon readout chip. However, differences between the lattice constants of HgCdTe alloys and Si renders this a challenging task.

It is known that epitaxial growth of HgCdTe on a silicon substrate requires several intermediate layers to mitigate the effects of lattice mismatch between HgCdTe and Si. Conventional approaches incorporate II–VI intermediate layers such as ZnTe, ZnSe, $CaF_2$, $BaF_2$ or GaAs grown on Si substrates.

For example, II–VI buffer layer have been deposited on GaAs initiation layers deposited on Si substrates (GaAs/Si) (e.g. Johnson et al., "*MOCVD grown on CdZnTe/GaAs/Si substrates for large area HgCdTe FPAs,*" *J. Electronics Materials*, vol. 22, 827 (1993)). However, the presence of As and Ga increases the potential for contamination of the detector structure, because these elements are active electrical impurities in HgCdTe. Furthermore, the epitaxial growth of GaAs/Si must be performed on a separate epitaxial growth system, or purchased from a vendor, either of which add significantly to the cost of producing the detector structures.

Another approach utilizes the deposition of II–VI buffer layers such as CdTe directly on Si substrates as shown by Sivananthan and co-workers (e.g. Chen et. al. *J. Electronic Materials*, vol. 22, 951 (1993)). However, it has been reported that the orientation of the II–VI buffer layer is not only dependent on the orientation of the substrate, but on the nucleation conditions. This gives rise to the potential for twinning, which can degrade the detector performance.

A third approach has been to deposit untwinned CdZnTe layer on a ZnTe film grown on Si substrates (e.g. deLyon et al. *Appl. Phys. Lett.*, vol. 63, 818(1993)). However, the crystalline quality of CdZnTe is not as good as that of CdTe layers deposited on Si because of phase separation problems. In addition, CdTe is not lattice-matched to HgCdTe, which results in the generation of dislocations in the detector structure which degrade its performance. Despite its lattice mismatch with silicon of about 18 percent, a $Cd_{0.96}Zn_{0.04}Te$ epilayer deposited on Si substrates is fully relaxed at the growth temperature, because of the generation of misfit dislocations. However, when the CdZnTe/ZnTe/Si structure cools from the growth temperature to room temperature, the difference in the thermal expansion coefficients produces unequal contractions in the epilayer and the substrate, which creates a biaxial tensile stress in the epilayer. This biaxial tensile stress induces the creation of additional dislocations. Furthermore, relatively high growth temperature of CdZnTe which is in excess of 250° C. is an intrinsic limitation.

In addition, buffer layers having a plastic deformation threshold lower than that of the overlayer have been deposited on substrates in structures including overlayers made of GaAs, ZnSe or $(Al_xGa_yIn_z)(P_AAs_BSb_C)$. For example, GaAs overlayers have been grown on softer II–VI buffer layers that have been deposited onto the Si substrates (e.g. D. K. Biegelsen, U.S. Pat. Nos. 4,935,385 and 4,994,867). However, the buffer layer in a detector structure has to be transparent at the detection wavelength(s) of the detector. The hardness (deformation threshold) and the band gap energy is inversely proportional with the Hg mole fraction in II–VI compounds such as HgCdTe and HgZnTe alloys. Thus, a softer buffer layer is not transparent at the detector wavelength, rendering the detector inoperable.

Furthermore, a Group II fluoride layer such as $CaF_2$ or $BaF_2$ has been deposited first on the Si substrate prior to the deposition of a II–VI layer (e.g. Zogg et. al., "*Heteroepitaxy of II–VI and IV–VI semiconductors on Si Substrates,*" *SPIE Physical Concepts of Materials for Novel Optoelectronic Device Application*, vol. 1361, 406 (1990)). However, the crystalline quality is inferior to that obtained by employing GaAs/Si or directly on Si. Moreover, the deposition of $CaF_2$ or $BaF_2$ buffer layers requires an additional vapor phase epitaxial growth system, that adds substantially to the cost of producing the detectors.

As described above, although various approaches have been attempted the quality of II–VI buffer layers grown on Si substrates has not been satisfactory for purposes of fabricating infrared detectors.

SUMMARY OF THE INVENTION

The present invention relates to an epitaxial structure for the growth of a high quality infrared detector structure having a transparent buffer layer comprising a Hg-based II–VI material such as $(Zn_xCd_yMg_zHg_{1-x-y-z})(S_BSe_ATe_{1-A-B})$ and an overlayer including a detector layer made of an Hg-based II–VI material deposited on Si- or Ge-based substrates.

In accordance with a preferred embodiment of the present invention, the epitaxial structure includes a substrate, an initiation layer, a buffer layer that is transparent at the operating frequencies of the detector and an overlayer. The present invention also encompasses a novel method of making a high quality epitaxial template required for the subsequent growth of the detector structure. The method steps include providing an initiation layer over a substrate, providing a buffer layer transparent at the operating frequencies of the detector device over the initiation layer and providing the detector overlayer deposited on the buffer layer. The overlayer may consist of any photovoltaic or photoconductive detectors, including unispectral detectors such as p-on-n, n-on-p, p-i-n, n-i-p and APD detectors as well as any multispectral detectors.

Because Hg-based II–VI compounds such as HgCdTe and HgZnTe alloys are fully miscible material systems, the structural perfection of buffer and detector films is consistently better than that of CdZnTe buffer layers and often exceeds that of CdTe buffer layers which are commonly used in the industry.

Because the growth of the buffer layer of the present invention is conducted at a temperature which is about 100 C below that required for the growth of the conventional CdZnTe buffer layer, a smaller biaxial stress is created during cooldown, and hence fewer dislocations are introduced in the buffer epilayer.

In addition, Hg vacancies present in as-grown vapor phase epitaxial Hg-based II–VI buffer layers such as $Hg_{1-x}Cd_xTe$, facilitate dislocation climb, thereby enhancing dislocation motion and promoting dislocation annihilation, which results in the reduction of the dislocation density in the buffer layer.

Moreover, by appropriately choosing the composition of the transparent buffer layer, it provides excellent lattice matching with the detector structure, which is crucial to minimize the generation of deleterious dislocations in the detector.

The invention itself, together with further objects and attendant advantages, will best be understood by reference to the following detailed description, taken in conjunction with the accompanying drawings.

DESCRIPTION OF THE PREFERRED EMBODIMENTS

Figure 1:
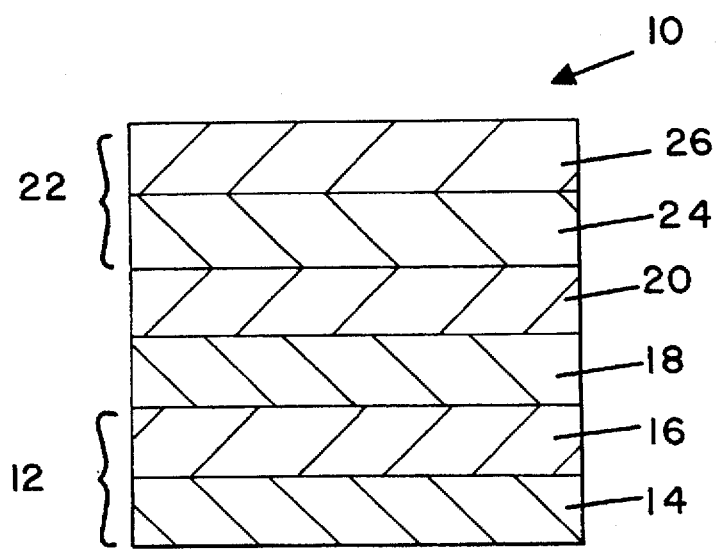
FIG. 1 is a schematic diagram of a cross-sectional view of an epitaxial structure for a detector in accordance with the present invention.

The present invention relates to a novel material system and epitaxial structure for a high performance semiconductor detector device with a low dislocation density especially useful for infrared applications. FIG. 1 illustrates an epitaxial structure 10 embodying the device and method of the present invention. As shown in FIG. 1, the epitaxial structure 10 employs a semiconductive support 12, an initiation layer 18, a buffer layer 20 and an overlayer 22.

In the illustrated epitaxial structure 10, the overlayer 22 includes a detector 26. Alternatively, the overlayer 22 also includes a grading layer 24. Preferably, the overlayer 22 includes both grading layer 24 and detector 26.

The semiconductive support 12 includes a semiconductive substrate 14. Alternatively, the semiconductive support 12 also includes a passivation layer 16 made of a semiconductor material. Preferably, the semiconductive support 12 includes both semiconductive substrate 14 and passivation layer 16 on a cleaned surface of the semiconductive substrate 14 to terminate the semiconductive substrate 14 surface.

The passivation layer 16 passivates the semiconductive substrate 14 and facilitates the epitaxial deposition of the initiation layer 18. The passivating layer 16 is generally a monolayer of an element chosen from Group II, III, V or VI of the periodic table. Thus, the passivators layer 16 may include Zn, Cd, Hg, In, Ga, P, As, Sb, Se or Te. The chemical makeup of the passivation layer 16 depends on the composition of the semiconductive substrate 14 and initiation layer 18. The semiconductive substrate may include bulk silicon (Si), bulk germanium (Ge), one or more layers of silicon over bulk germanium (Si/Ge), one or more layers of germanium over bulk silicon (Ge/Si) or alloys of silicon and germanium ($Si_aGe_{1-a}$). The initiation layer 18 includes a material suitable for the epitaxial growth of the buffer lay 20 of the present invention. For example, the initiation layer 18 may include II–VI semiconductor materials. Thus, the initiation layer 18 may include a binary II–VI compound such as MgTe, HgSe, ZnS, CdS, ZnSe, CdSe, ZnTe and CdTe or a heterostructure which is a combination of two binary alloys such as CdSe/ZnTe or CdTe/ZnS. Alternatively, the initiation layer 18 may be a heterostructure that includes a combination of ternary or quarternary compounds chosen from the II–VI family of alloys. When the epitaxial structure 10 includes a semiconductive substrate 14 made of Si and an initiation layer 14 made of a II–VI semiconductor material, the preferred passivation layer 16 is an element from Group V of the Periodic Table, such as arsenic (As), phosphorous (P) or antimony (Sb).

The buffer layer 20 and overlayer 22 include a Hg-based II–VI semiconductor material. Thus, the Hg-based semiconductor material may contain IIA and IIB elements from the periodic table. For example, the buffer layer 20 may include a material having the formula $(Zn_{X1}Cd_{Y1}Mg_{Z1}Hg_{1-X1-Y1-Z1})(S_{A1}Se_{B1}Te_{1-A1-B1})$ wherein X1, Y1, Z1, A1 and B1 range between 0 and 1 such that $Xi+Yi+Z1 \leq 1$ and $A1+B1 \leq 1$. The detector 26 includes a Hg-based II–VI material. For example, the detector 22 may include a material having the formula $(Zn_{X2}Cd_{Y2}Mg_{Z2}Hg_{1-X2-Y2})(Se_{A2}Se_{B2}Te)$ wherein X2, Y2, Z2, A2 and B2 range between 0 and 1 such that $X2+Y2+Z2 \leq 1$ and $A2+B2 \leq 1$. It is preferred that the buffer layer 20 and the detector 26 contain no magnesium (Z1=Z2=0), sulfur (A1=A2=0) and selenium (B1=B2=0). A necessary part of the invention requires that the buffer layer 20 is transparent at all of the operating frequencies of the detector 26. Thus, for example, in a preferred embodiment of detector structure 10, with the buffer layer 20 having the composition $Hg_{1-Y1}Cd_{Y1}Te$ and the portion of grading layer 24 closest to buffer layer 20 having the composition $Hg_{1-Y2}Cd_{Y2}Te$, it is essential that Y1>Y2.

The grading layer 24 includes several intermediate epilayers (not shown) to enhance carrier collection and offer lattice matching with the detector 26. The grading layer 24 is made of a Hg-based II–VI material. For example, the grading layer 24 may be a II–VI alloy material having the formula $(Zn_{X3}Cd_{Y3}Mg_{Z3}Hg_{1-X3-Y3})(Se_{A3}Se_{B3}Te)$ wherein X3, Y3, Z3, A3 and B3 range between 0 and 1 such that $X3+Y3+Z3 \leq 1$ and $A3+B3 \leq 1$. The intermediate epilayer in the grading layer 24 closest to the buffer layer 20 is lattice-matched to the buffer layer 20, while the intermediate epilayer closest to the detector 26 is lattice-matched to the detector 26.

Figure 2:
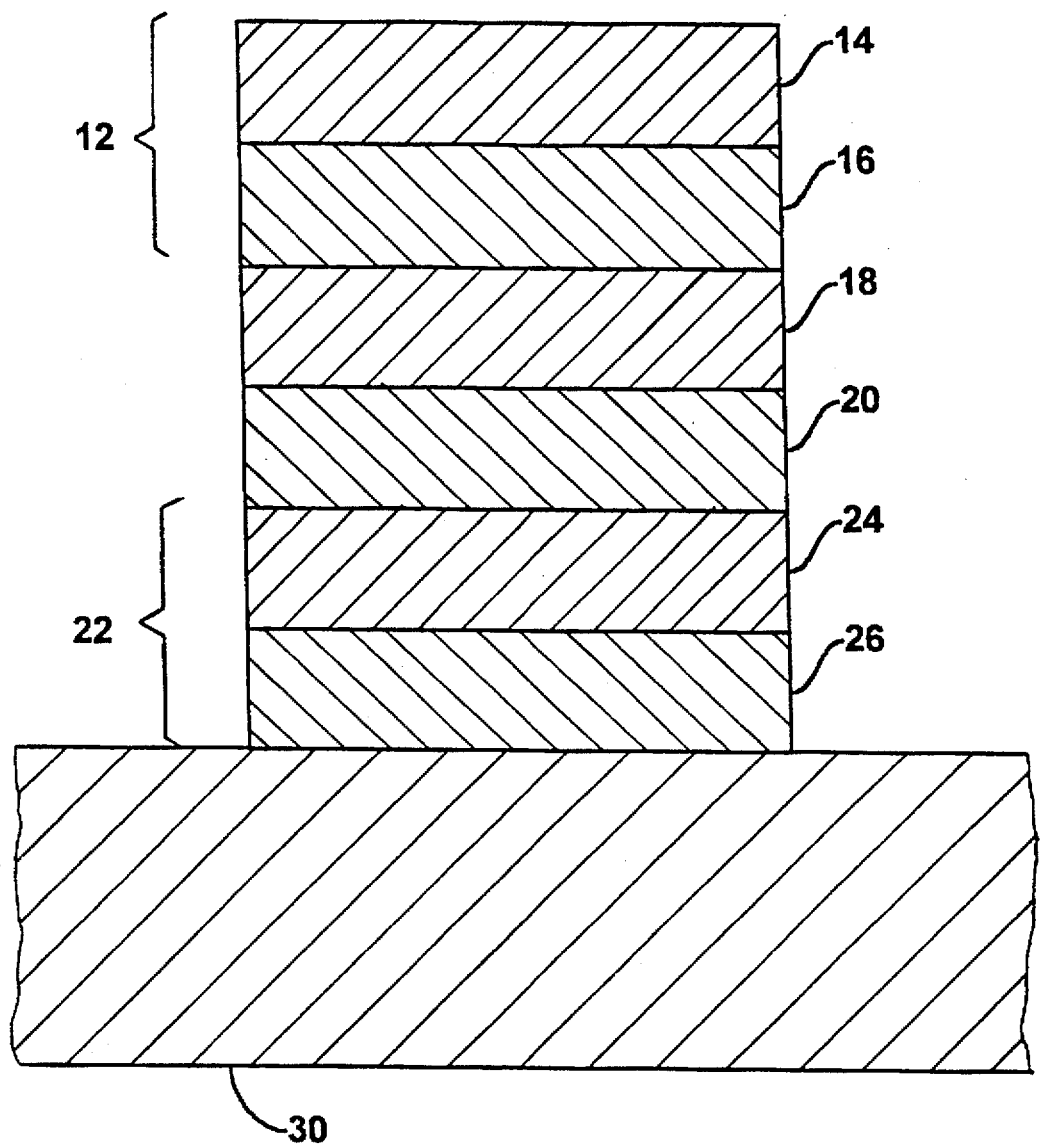
FIG. 2 is a schematic diagram of a cross-sectional view of a portion of a detector device in accordance with the present invention.

Referring now to FIG. 2, after the growth of the detector 26, the epitaxial structure 10 may then be indium bump-bonded to a read-out chip 30 as is known to those skilled in the art. The read-out chip 30 preferably comprises an Si substrate, but may comprise any other semiconductor suitable for the formation of the read-out electronics.

The detector 26 can be any unispectral or multispectral detector. For example, detector 26 can be a photovoltaic or photoconductive detector. In addition, detector 26 can be a unispectral detector such as p-on-n, n-on-p, p-i-n, n-i-p or APD. The preferred compositions of the detector 26 and buffer 20 layers and thickness of the detector 26 and grading 24 and buffer 20 layers depend upon the type of the device, because the band-gap and lattice constants of these layers vary with the compositions of these layers.

For example, Table I summarizes the variation of the band-gap and the lattice constant of a $Hg_{1-x}Cd_xTe$ material as a function of its composition, x.

TABLE I

The lattice constant and composition of $Hg_{1-x}Cd_xTe$ for selected values of cut-off wavelengths at 77K

| $\lambda$co at 77K ($\mu$m) | Lattice constant (Å) | x value of $Hg_{1-x}Cd_xTe$ |
| --- | --- | --- |
| 3.50 | 6.4688 | 0.370 |
| 4.00 | 6.4682 | 0.342 |
| 5.00 | 6.4674 | 0.303 |
| 6.00 | 6.4668 | 0.277 |
| 7.00 | 6.4664 | 0.258 |
| 8.00 | 6.4661 | 0.245 |
| 9.00 | 6.4659 | 0.234 |
| 10.00 | 6.4657 | 0.225 |
| 11.00 | 6.4656 | 0.218 |
| 12.00 | 6.4655 | 0.212 |

Referring to Table I, the radiation of interest for (LWIR) detectors is normally about 10 µm. Thus, the cut-off wavelength of a buffer layer 20 having the composition $Hg_{1-x}Cd_xTe$ is less than 10 µm and preferably about 8 µm. The composition of the $Hg_{1-x}Cd_xTe$ grading layer 24 varies from x=0.245 to x=0.225 over a thickness of about two microns. This band-gap grading enhances the quantum efficiency of the detector 26, by confining the carriers away from interfaces. The transparent $Hg_{1-x}Cd_xTe$ buffer layer 20 preferably has a composition of x=0.245, and hence is transparent at the 10 µm detection wavelength. For an MWIR detector operating at 5 µm at 77K, an $Hg_{1-x}Cd_xTe$ buffer layer 20 with x=0.370 would be suitable.

As previously mentioned grading layer 24 is an optional design element. If the grading layer 24 is not employed, the mismatch between the buffer layer 20 and the detector 26 is only 0.006%, similar to that observed in conventional HgCdTe detectors grown on bulk $Cd_{1-x}Zn_xTe$ substrates with x=0.03.

The growth of the epitaxial structure 10 can be achieved by conventional vapor-phase epitaxial growth techniques. For example, the epitaxial structure can be grown by molecular beam epitaxy (MBE), metalorganic molecular beam epitaxy (MOMBE), gas-source molecular beam epitaxy (GSMBE), chemical beam epitaxy (CBE) or metalorganic chemical vapor deposition (MOCVD). Preferably, the epitaxial structure 10 is grown by a low temperature vapor-phase epitaxial growth process. Thus for example, the epitaxial structure 10 can be grown by molecular beam epitaxy (MBE), metalorganic molecular beam epitaxy (MOMBE), gas-source molecular beam epitaxy (GSMBE) or chemical beam epitaxy (CBE). The preferred growth temperature is between about 170° and 180° C. when the buffer layer 20 is made of $Hg_{1-y1}Cd_{y1}Te$.

In a preferred embodiment of the present invention, the epitaxial structure 10 includes a semiconductive substrate 14 made of Si, a passivation layer 16 made of an arsenic material and an initiation layer 18 made of a II-VI semiconductor material. The passivation layer 16 can be grown using elemental As or other As-containing precursors such as arsine or t-butyl arsine (t-BuAsH$_2$) by using any conventional deposition processes known in the art. U.S. Pat. No. 5,306,386 to de Lyon, assigned to the same assignee, discloses a growth method. In de Lyon, the passivation layer 16 is grown in a vacuum growth chamber using elemental arsenic or other As-containing precursors. U.S. Pat. No. 5,382,542 to Zinck et al., also assigned to the same assignee, discloses an alternative growth method. In Zinck et al., the passivation layer 16 can be grown in a vacuum growth chamber by exposing the silicon semiconductive substrate 14 to vapors from an arsenic metalorganic compound having the formula $R_{3-m}AsH_m$, where R is an organic radical selected from the group consisting of $C_nH_{2n+1}$ and $C_nH_{2n-1}$, where n ranges from 1 to 6 and where m is 1 or 2, for a period of time to ensure passivation of the surface of the semiconductive substrate 14. Specific examples of the arsenic metalorganic compound include t-butyl arsine, isopropyl arsine, ethyl arsine, neopentyl arsine, cyclohexyl arsine, allyl arsine and vinyl arsine. The preferred method of growing the passivation layer 16 is the de Lyon method.

The present invention takes advantage of the principle that dislocation interaction can be enhanced by the presence of vacancies that facilitate dislocation motion and interaction. For example, because MBE and MOMBE are non-equilibrium growth process, and because Hg has high vapor pressure, the Hg vacancy in the $Hg_{1-x}Cd_xTe$ layer is in excess of $1\times10^{16}$ cm$^{-3}$ at a growth temperature of 180° C. Vacancies assist in dislocation climb, which is an additional mode of movement besides dislocation glide. In the absence of features such as micro-precipitates and regions with strain fields due to small fluctuations in alloy composition. However, the vacancy assisted climb mechanisms permits a dislocation to move out of the slip plane onto parallel planes next to the original slip plane. This permits the motion of a dislocation along different slip plane and also around dislocation pinning sites, thereby enhancing dislocation interaction and hence their annihilation.

The advantages and other characteristics of the present invention are best illustrated by the following example.

EXAMPLE

The epitaxial growths of two conventional HgCdTe detector structures (detector A and detector B) and one HgCdTe detector structure incorporating a HgCdTe buffer (detector C) on silicon substrate were conducted in a commercially available VG V-80 MBE system, equipped with a Hg-diffusion pump. The background pressure in the deposition chamber was greater than $3\times10^{-9}$ mBar. The source materials used were elemental Hg, Te and binary CdTe and were evaporated to provide typical beam equivalent pressures of $4\times10^{-4}$, $1\times10^{-6}$ and $8\times10^{-6}$ mBar, respectively, for the growth of HgCdTe materials. In and As were employed as the n- and p-type dopants respectively. The initiation layer is grown on the silicon substrate with a (211)B surface orientation. The composition of the detector in all three detector structures is $Hg_{1-x}Cd_xTe(x=0.2\pm0.05)$. The detector structures were p-on-n devices. the composition and thickness of the initiation and buffer layers are summarized in Table II.

TABLE II

Epitaxial Layers of Detectors A, B, and C

| Detector | Composition buffer/initiation | Thickness (μm) buffer/initiation |
|---|---|---|
| A | $Cd_{0.99}Zn_{0.01}Te/ZnTe$ | 9/1 |
| B | CdTe/ZnTe | 9/1 |
| C | $Hg_{0.74}Cd_{0.26}Te/ZnTe$ | 9/1 |

The buffer layers of Detectors A and B were grown at 250° C. The buffer layer of Detector C was grown at about 180° C. The structural perfection of composite epilayers were evaluated by x-ray double crystal rocking curve measurements. Table III summarizes the results.

TABLE III

Full Width Half Maximum (FWHM) X-ray Measurements

| Detector | x-ray FWHM (arc sec.) |
|---|---|
| A | 180 |
| B | 101 |
| C | 92 |

As shown by Table III, structural perfection of detector C is much better than that of the detectors A and B that embody conventional epitaxial structures.

Because the $Hg_{1-x}Cd_xTe$ materials are fully miscible with CdTe for all composition, the structural perfection of $Hg_{1-x}Cd_xTe$ films is consistently better than that of CdZnTe and often exceeds that of CdTe films. In contrast, the crystalline quality of epitaxially grown $Cd_{1-x}Zn_xTe$ (x≈0.04) is inferior to that of CdTe because the material is prone to phase separation as the composition deviates from that of the end point binaries.

In addition, because growth of the $Hg_{1-x}Cd_xTe$ buffer layer is conducted at a temperature which is about 100° C. below that required for the growth of the conventional CdZnTe buffer layer, a smaller biaxial stress is created during cool-down, and hence fewer dislocations are introduced in the buffer epilayer. Furthermore, Hg vacancies present in the $Hg_{1-x}Cd_xTe$ facilitate dislocation climb, thereby enhancing dislocation motion and promoting dislocation annihilation, which results in the reduction of the dislocation density in the buffer layer.

Moreover, using $Hg_{1-x}Cd_xTe$ as a transparent buffer provides good lattice matching with the detector structure. The level of lattice matching achieved by using a transparent $Hg_{1-x}Cd_xTe$ buffer layer is similar to that obtained by using bulk CdZnTe substrates. For example, lattice mismatch between the transparent $Hg_{1-x}Cd_xTe$ buffer layer and the LWIR detector structure is only about 0.006%. In contrast, the lattice mismatch between $Cd_{1-x}Zn_xTe$ films with compositions x=0.03 and 0.04 (commercially available substrates) is also 0.06%. Thus, an appropriate choice for the composition of the transparent buffer provides excellent lattice matching with the detector structure. This property is crucial to minimize the generation of deleterious dislocations in the detector.

Of course, it should be understood that a wide range of changes and modifications can be made to the preferred embodiment described above. It is therefore intended that the foregoing detailed description and example be regarded as illustrative rather than limiting and that it be understood that it is the following claims, including all equivalents, which are intended to define the scope of this invention.

What is claimed is:

1. An epitaxial structure for a detector structure comprising:
   a buffer layer comprising a first Hg-based II–VI material, wherein the buffer layer is transparent at the operating frequencies:
   an overlayer over the buffer layer, said overlayer comprising a detector comprising a second Hg-based II–VI material, said detector being capable of operating at one or more operating frequencies, and
   further comprising a semiconductive support under the buffer layer comprising a semiconductive substrate selected from the group consisting of Si, Ge, Si/Ge, Ge/Si and $Si_aGe_{1-a}$, and
   an initiation layer between the buffer layer and the semiconductive support, said initiation layer comprising a II–VI semiconductor material.

2. The epitaxial structure of claim 1 wherein the II–VI semiconductor material is selected from the group consisting of MgTe, HgSe, ZnS, CdS, ZnSe, CdSe, ZnTe and CdTe CdTe/ZnTe and CdTe/ZnS.

3. The epitaxial structure of claim 2 wherein the buffer layer comprises $Hg_{1-Y1}Cd_{Y1}Te$, the detector comprises $Hg_{1-Y2}Cd_{Y2}Te$, and Y1>Y2.

4. The epitaxial structure of claim 2 wherein the buffer layer comprises $(Zn_xCd_yMg_zHg_{1-x-y-z})$ $Se_AS_BTe$.

5. The epitaxial structure of claim 4 wherein the values of Z, A and B are zero.

6. The epitaxial structure of claim 4 wherein said semiconductive support further comprises a passivation layer, said passivation layer comprising of an element selected from the group consisting of Group II, III, V or VI of the periodic table.

7. The epitaxial structure of claim 6 wherein said semiconductive substrate is Si and said passivation layer comprises an element selected from the group consisting of As, P and Sb.

* * * * *